United States Patent [19]
Jiang

[11] Patent Number: 5,943,288
[45] Date of Patent: Aug. 24, 1999

[54] APPARATUS AND METHOD FOR MINIMIZING ADDRESS HOLD TIME IN ASYNCHRONOUS SRAM

[75] Inventor: Yong H. Jiang, Milpitas, Calif.

[73] Assignee: Integrated Silicon Solution, Inc., Santa Clara, Calif.

[21] Appl. No.: 08/961,748

[22] Filed: Oct. 31, 1997

[51] Int. Cl.$^6$ .................................................. G11C 8/00
[52] U.S. Cl. ................. 365/230.06; 365/194; 365/233.5
[58] Field of Search .............................. 365/230.06, 194, 365/230.08, 233.5

[56] References Cited

U.S. PATENT DOCUMENTS

| | | | |
|---|---|---|---|
| 4,947,374 | 8/1990 | Wada et al. ........................... | 365/233.5 |
| 5,214,609 | 5/1993 | Kato ..................................... | 365/233.5 |
| 5,245,573 | 9/1993 | Nakaoka .............................. | 365/233.5 |
| 5,428,580 | 6/1995 | Kawashima et al. ................ | 365/233.5 |
| 5,640,363 | 6/1997 | Futurani et al. ..................... | 365/233.5 |

*Primary Examiner*—Son T. Dinh
*Attorney, Agent, or Firm*—Gary S. Williams; Pennie & Edmonds LLP

[57] ABSTRACT

A write control circuit and method for an asynchronous SRAM that minimizes the write address hold time required to prevent data from being written to incorrect addresses in the memory. The write control circuit temporarily disables a write circuit in the memory whenever the memory address changes. The delay of the write control circuit from input to output is shorter than the delay of a decoder in the memory.

5 Claims, 7 Drawing Sheets

APPARATUS AND METHOD FOR MINIMIZING ADDRESS HOLD TIME IN ASYNCHRONOUS SRAM

The present invention relates generally to memory devices, and particularly to circuits implemented within asynchronous static random-access memory devices for minimizing the hold-time required for address signals.

BACKGROUND OF THE INVENTION

Conventional asynchronous static random-access memories (SRAMs) rely upon carefully controlled memory access signal delays for proper operation. Changing operating conditions and other factors can cause variations in signal timing that can create memory write errors. The following background is provided to more clearly describe this problem.

Asynchronous SRAMs are widely used high speed memory devices. The operation of asynchronous SRAMs is well known and therefore is only briefly described herein. FIG. 1 illustrates a block diagram of an asynchronous SRAM 100. The controller 122 initiates a memory operation by asserting a chip enable signal 101 and supplying address signals A0–AN (corresponding to $2^{N+1}$ memory locations) designating the address of a memory location where the operation is to be performed. If the memory operation is a write operation, the controller 122 supplies the data to be written to the address memory location via the bi-directional input/output line I/O0–I/OK (corresponding to K+1 bit memory words). If the memory operation is a read operation, the stored information from the addressed location is read out from the same bi-directional input/output lines I/O0–I/OK. The memory 100 also provides connections for external power supply (VCC) and ground (GND) signals.

The heart of the memory 100 is the memory array 112, which consists of static memory cells, each capable of storing one bit of data, arranged in rows and columns. In the conventional manner, all of the cells in one row are energized for a memory operation (either a read or a write) by a word line WL uniquely associated with that row. A memory operation cannot be performed unless the word line associated with the target row of cells is activated.

At least a subset of the cells in a row (typically all of the cells that store data for one memory word) can be accessed simultaneously for a given memory operation via the bit lines BL. When the memory operation is a read, the bit lines BL are coupled to sense amplifiers in the column I/O 120 that sense the data stored in the corresponding cells of the row whose word line WL is active. When the memory operation is a write, the bit lines BL carry the signals used to program the corresponding cells of the row associated with the active word line.

The control circuit 116 controls the other blocks of the memory 100 in response to the chip enable signal 101 and control signals 103. Control signals 103 may include a write signal (WRTB) to initiate a write operation to the memory. Depending on the operation to be performed, the control circuit issues the appropriate control signals 117a, 117b to the decoder 114 and the I/O data circuit 118, respectively.

Regardless of whether the memory operation is a write or a read, the decoder 114 decodes the address signals A0–AN and activates the word line WL of the row that includes the memory word that is the target of the current memory operation.

If the operation is a write, the I/O data circuit 118 buffers the input data signals I/O0–I/OK and outputs the buffered data to the column I/O 120 via the bi-directional data bus 119. The column I/O 120 then latches the input signals in parallel onto the corresponding bit lines BL0–BLK. The signals on the bit lines BL0–BLK are used to program the cells composing the word whose word line was activated for the current operation by the decoder 114.

If the operation is a read, sense amplifiers (SA) in the column I/O 120 sense the signals on the respective bit lines BL, convert the sensed signals into binary (e.g., high or low) voltages that represent the programmed state of the addressed word and output the word's bit values to the I/O data circuit 118 via the bi-directional bus 119. The output data are buffered by the I/O data circuit 118 and latched onto the bi-directional data lines I/O0–I/OK for use by the controller 122.

FIG. 2 illustrates a conventional control circuit for the memory of FIG. 1. An X address signal Ax 250 is coupled to a decoder 210 and an address transition detection (ATD) circuit 212. The output of decoder 210 drives a word line WL 260 which selects a memory cell 224. Similarly, a Y address signal Ay 252 is coupled to a decoder 218 and to an ATD circuit 232. The output of decoder 218 is a column select signal COL 258 which couples a corresponding bit/bit-bar line pair BL/$\overline{BL}$ to a local I/O bus 264.

If memory array 112 is partitioned into blocks, a Z address signal Az 253 is coupled to a decoder 245 and at ATD circuit 241. The output of decoder 245 is a block select BLK signal 259 used to enable a particular block for a write or read.

X address signal Ax, Y address signal Ay and Z address signal Az each typically comprise a plurality of address lines. Similarly, typically decoder 210 has a plurality of word line outputs, decoder 218 has a plurality of column select outputs and decoder 245 has a plurality of block select outputs. These decoder outputs access an array of memory cells 224. For simplicity, only one small part of this array is illustrated in FIG. 2 with a single memory cell 224.

ATD circuits 212, 232 and 241 each output a pulse whenever a rising edge or falling edge transition occurs in their address signal input. Therefore, when address signals Ax, Ay or Az change, the corresponding ATD circuit outputs a pulse to equalization circuit 242. In response, equalization circuit 242 asserts EQ signal 256 to precharge and equalize the bit/bit-bar line pair BL/$\overline{BL}$ and local I/O bus 264 using precharge transistors (not shown) and transistor 230 (which may be eliminated in some implementations). This operation prevents the data stored on the BL/$\overline{BL}$ pair from being further written to any memory cell in the column. It also prepares the BL/$\overline{BL}$ pair and local I/O bus for a subsequent write or read operation.

Write circuit 239, comprising transistors 236 and 238, couples data line pair D/$\overline{D}$ (266/288) to local I/O bus 264. Write circuit 239 enables data defined by pair D/$\overline{D}$ to be written to a memory cell 224 during a write operation.

FIG. 2A illustrates a timing diagram for a write operation for the conventional control circuit of FIG. 2. At the beginning of the write operation, a new address $A_1$ comprising X address signal Ax, Y address signal Ay, and Z address signal Az is received by memory 100.

Some time after the change of address occurs, WL signal 260, COL signal 258 and BLK signal 259 transition high in response to the receipt of address A1. The delay between the change of address and the assertion of WL signal 260, COL signal 258 and BLK signal 259 is caused by the delay of decoders 210, 218 and 245 and any other delays in the circuit path from the pins for address signals Ax, Ay and Az to the WL, COL and BLK lines. The delay for the three signals is shown as equal but may be different.

Some time after the change of address occurs, a write bar (WRTB) signal 254 is asserted. WRTB is an active low signal. In response, a write pulse (WPL) signal 262 transitions high a short time later. The delay between the assertion of WRTB signal 254 and the transition of WPL signal 262 is caused by the delay of a buffer 246, a NAND gate 270, an inverter 271, and any other delays in the circuit path from the pin for WRTB signal 254 to WPL signal 262. The assertion of WPL signal 262 causes transistors 236 and 238 of write circuit 239 to become enabled, allowing data defined by data lines pair D/$\overline{D}$ to be written to selected memory cell 224.

After a time sufficient to write the data to memory cell 224, WRTB signal 254 is deasserted. In response, WPL signal 262 transitions low a short time later, disabling write circuit 239.

At about the same time or shortly after WRTB signal 254 is deasserted, address A may change from address $A_1$ to address $A_2$. The period of time that address $A_1$ is held after WRTB signal 254 is deasserted is called the write address hold time, or $t_{HA}$. In response to the new address, WL signal 260, COL signal 258 and BLK signal 259 are deasserted and a different word line, column select line and block select line (not shown) are asserted. At this point, a new memory operation has begun.

FIG. 2A shows the desired timing relationships between the various signals within memory 100. In this figure, $t_{HA}$ is positive with address A held constant until after WRTB signal 254 is deasserted. A positive $t_{HA}$ ensures that the selected word line, column select line and block select line do not change while WPL signal 262 is still asserted. If the address changes to $A_2$ before WRTB signal 254 is deasserted (i.e., $t_{HA}$ is negative), however, the new word line, column select line and block select line corresponding to address $A_2$ may turn on while WPL signal 262 is still asserted. Because write circuit 239 would still be enabled, data would be improperly written to address $A_2$. This condition may even occur with a small positive $t_{HA}$ due to signal timing deviations caused by varying processing, temperature or voltage conditions. Therefore, memory write errors may occur if memory 100 is provided with address signals having a very small or negative write address hold time $t_{HA}$.

However, systems employing such asynchronous memories are being operated at progressively higher clock speeds that dictate increasingly tight timing constraints. As a result, these systems typically provide the asynchronous memories with short write address hold times $t_{HA}$, sometimes approaching zero nanoseconds.

In view of the foregoing, there is a need for a circuit in an asynchronous SRAM that minimizes the write address hold time required to prevent data from being written to incorrect addresses in the memory.

SUMMARY OF THE INVENTION

In summary, the present invention is an apparatus and method for an asynchronous SRAM having a decoder and a write circuit that minimizes the write address hold time required to prevent data from being written to incorrect addresses in the memory. The apparatus of the present invention comprises a write control circuit that temporarily disables the write circuit whenever the memory address changes. The delay of the write control circuit from input to output is shorter than the decoder delay.

The method of the present invention includes the steps of detecting a change of memory address and, upon detecting the change, temporarily disabling the write circuit before the word line or block select line in the memory corresponding to the new address is asserted.

In an embodiment of the present invention, the write control circuit includes an address transition detection (ATD) circuit whose output is coupled to the write circuit of the memory. The ATD circuit generates a pulse whenever the X or Z memory address changes to disable the write circuit. The delay of the ATD circuit is such that the total delay of the write control circuit is shorter than the delay of the decoder.

The present invention prevents data from being written to incorrect addresses in the memory by disabling the write circuit before the selected word line or block select line changes at the end of a write operation to reflect the change of address. The present invention accomplishes this by using a write control circuit that both (1) uses the same address inputs as the decoder circuit and (2) has a shorter delay than the decoder.

The present invention disables the write circuit upon detecting a change of address rather than upon the deassertion of the write (WRTB) signal. Because of this, the address does not need to be held constant until the WRTB signal is deasserted in order to prevent writes to incorrect addresses. As a result, the required write address hold time $t_{HA}$ is reduced.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 3:
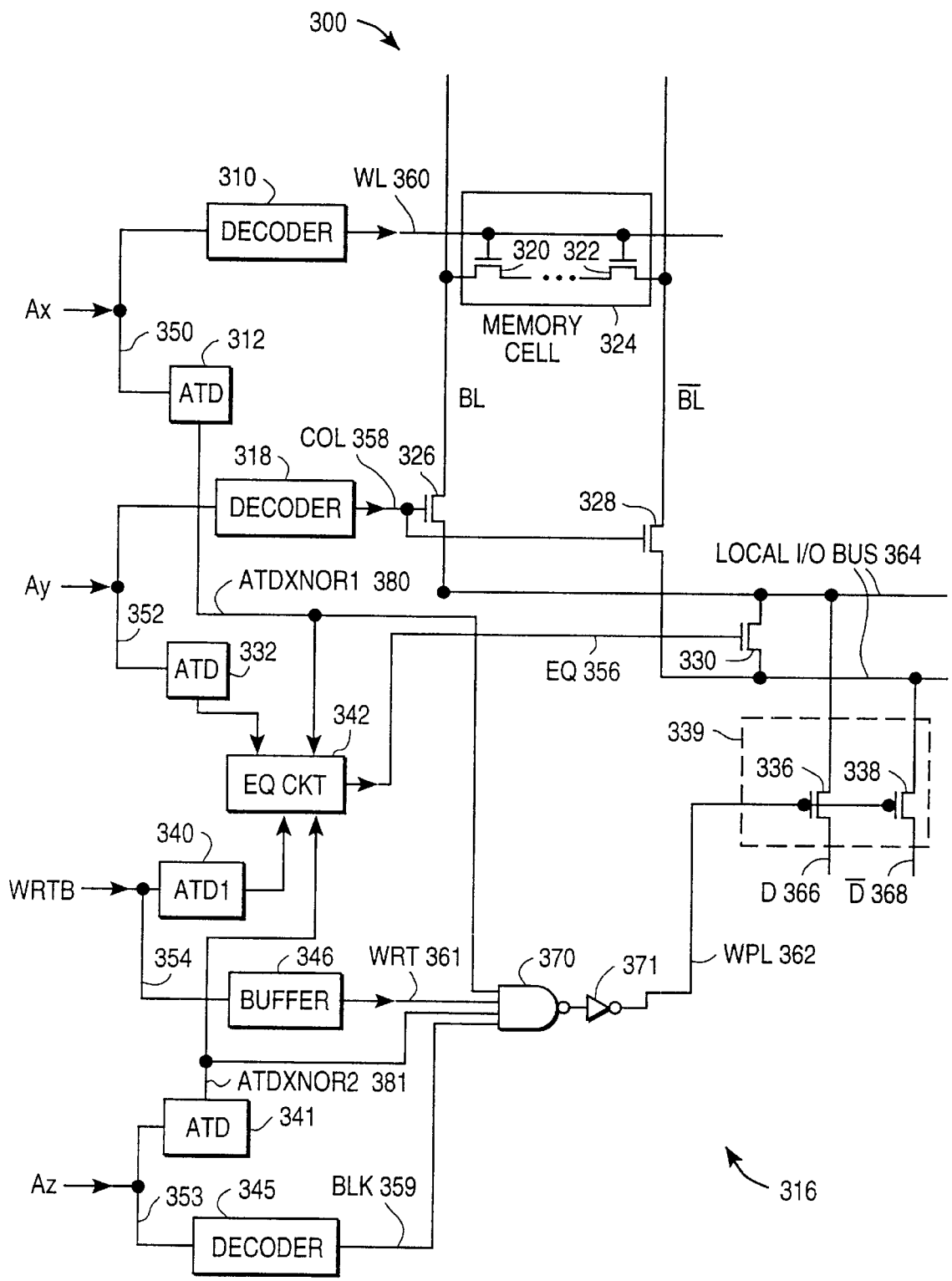
FIG. 3 illustrates a write control circuit in accordance with an embodiment of the present invention.

FIG. 3 illustrates a write control circuit 316 in accordance with an embodiment of the present invention.

The write control circuit is contained in an asynchronous memory 300. Memory 300 is similar in many respects to the memory described in the background section and therefore, only aspects of the memory particularly pertinent to the present invention will be described herein. Memory 300 includes an address A comprising an X address signal Ax 350, a Y address signal Ay 352 and a Z address signal Az 353. Address signals Ax, Ay and Az each comprise a plurality of address lines. Memory 300 also includes decoders 310, 318 and 345, each having a plurality of inputs and outputs (only one input and output is shown in the figure). The inputs of decoder 310 are coupled to X address signal Ax. The inputs of decoder 318 are coupled to Y address signal Ay. The inputs of decoder 345 are coupled to Z address signal Az. The outputs of decoder 310 comprise a plurality of signals WL 360. Each signal WL is coupled to a row of memory cells 324 in memory array 112. The outputs of decoder 318 comprise a plurality of signals COL 358. Each signal COL is coupled to a pair of transistors 326 and 328 in a column of memory array 112. The outputs of decoder 345 comprise a plurality of signals BLK 359. Each signal BLK 359 is coupled to a block of memory array 112.

In one embodiment of the present invention, memory 300 is a 128 kilobyte (KB) asynchronous SRAM with a 17 bit address A. Memory 300 is physically organized into 16 blocks, each block comprising a 1K×3 byte array of memory cells. X address signals Az comprises 10 address lines for selecting one of the 1K (i.e., $2^{10}$) rows in each block. Y address signal Ay comprises three address lines for selecting one of the eight (i.e., $2^3$) bytes in each row. Z address signal Az comprises four address lines for selecting one of the 16 (i.e., $2^4$) blocks in the memory.

Write control circuit 316 includes an address transition detection (ATD) circuit 312 and an ATC circuit 341. X address signal Ax is coupled to an input of ATD circuit 312. Similarly, Z address signal Az is coupled to an input of ATD circuit 341. ATD circuit 312 includes an output ATDXNOR1 380, which generates a pulse of a predetermined width whenever any of the address lines of the X address signal Ax have a rising or falling edge signal transition, i.e., whenever the X address changes. Similarly, ATD circuit 341 includes an output ATDXNOR2 381, which generates a pulse of a predetermined width whenever the Z address changes.

ATDXNOR1 380 and ATDXNOR2 381 are active low signals. ATDXNOR1 380 and ATDXNOR2 381 are coupled to other elements within write control circuit 316 as described below and in addition, to an EQ circuit 342.

Write control circuit 316 also includes an input line to receive write signal WRTB 354 and a buffer 346. WRTB signal 354 is an active low signal. WRTB signal 354 is coupled to an input of buffer 346, which outputs an inverted version of the WRTB signal, WRT signal 361.

Write control circuit 316 further includes a NAND gate 370, an inverter 371 and a WPL signal 362. The signals ATDXNOR1 380, ATDXNOR2 381, WRT, and a block select line BLK 359 from decoder 345 are coupled to the inputs of NAND gate 370. In other embodiments, a signal generated by an ATC circuit 332 in response to a Y address signal Ay change may also be coupled to one of the inputs of NAND gate 370. The output of NAND gate 370 is coupled to the input of inverter 371. Inverter 371 outputs WPL signal 362.

WPL signal 362, which is the output of write control circuit 316, is coupled to the gate terminals of transistors 336 and 338, which comprise a write control 339 of memory 300. As described in further detail below, write circuit 339 enables data to be written to memory cell 324.

Figure 3A:
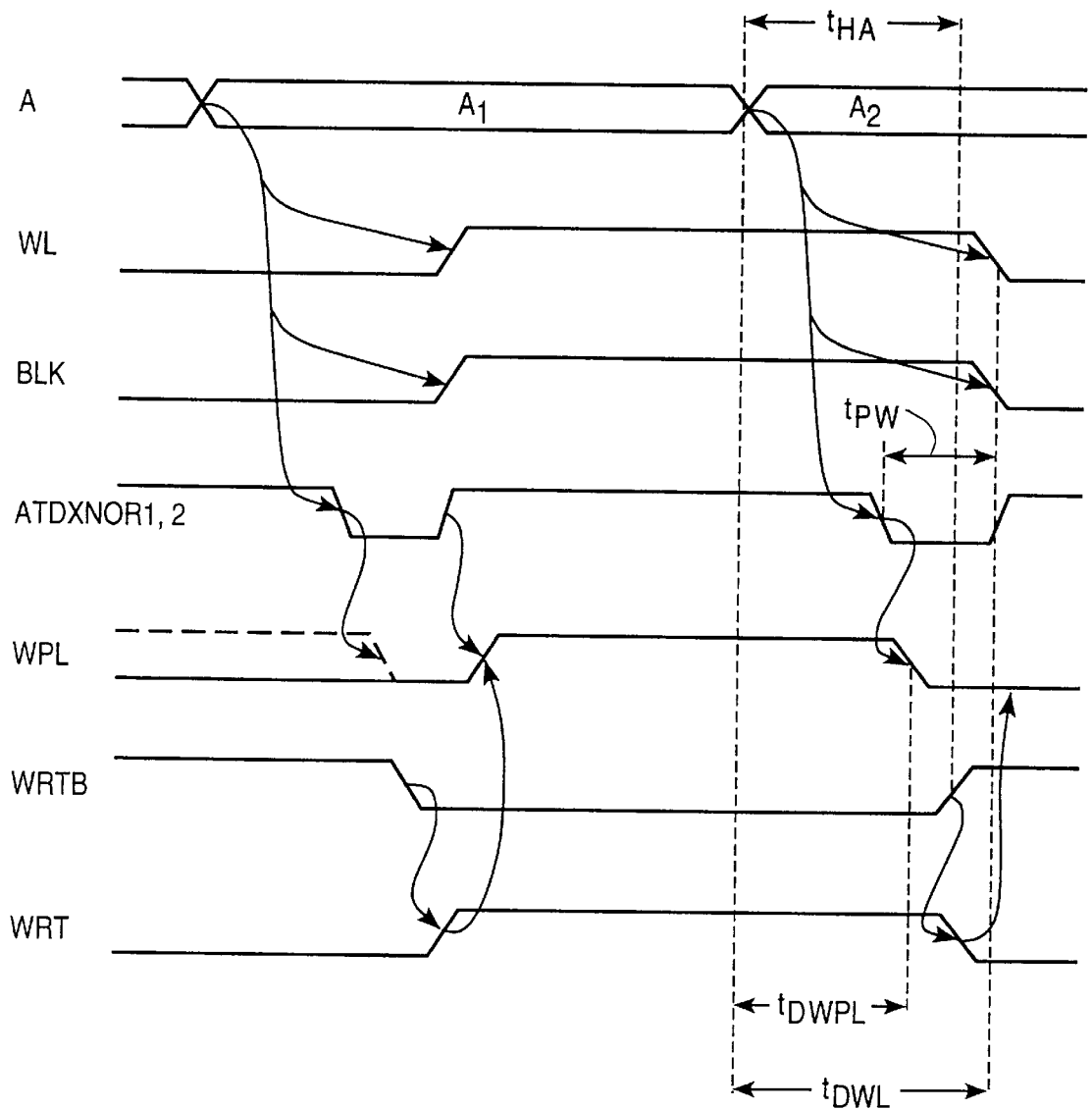
FIG. 3A illustrates a timing diagram for a write operation for the write control circuit of FIG. 3.

FIG. 3A illustrates the operation of write control circuit 316 during a write to memory 300. The end portion of the write operation will be discussed in more detail than the beginning portion since it is of greater relevance to the present invention.

At the beginning of the write operation, a new address $A_1$ comprising X address signal Ax, Y address signal Ay, and Z address signal Az is received by memory 300.

A short time after the receipt of address $A_1$, if either Ax or Az has changed value, ATDXNOR1 380 and/or ATDXNOR2 381 pulse low in response to the change of address. In turn, WPL signal 362 pulses low a short time later. The WPL signal pulse temporarily disables write circuit 339.

Some time after ATDXNOR1 380 and ATDXNOR2 381 transition low, WL signal 360 and BLK signal 359 transition high in response to the receipt of address $A_1$.

Some time after address $A_1$ is received, WRTB signal 254 is asserted (transitions low) to signal a write operation. In response, WRT signal 361 transitions high a short time later.

With all inputs to NAND gate 370 (ATDXNOR1 380, ATDXNOR2 381, WRT 361, and BLK 359) high at this time, WPL signal 362 transitions high a short time later. The assertion of WPL signal 362 causes transistors 336 and 338 of write circuit 339 to become enabled, allowing data defined by data lines pair D/$\overline{D}$ to be written to selected memory cell 324.

While WRTB signal 254 is still asserted, address A may change from address $A_1$ to address $A_2$. This condition occurs when the write address hold time $t_{HA}$ provided to memory 300 is less than zero, as shown in the figure. Assuming that either Ax or Az are different for addresses $A_1$ and $A_2$, a short time after the receipt of address $A_2$ ATDXNOR1 380 and/or ATDXNOR2 381 transition low in response to the change of address.

In response to the assertion of ATDXNOR1 380 and/or ATDXNOR2 381, WPL signal 362 transitions low a short time later. The deassertion of WPL signal 362 causes transistors 336 and 338 of write circuit 339 to become disabled, preventing the data stored on the D/$\overline{D}$ pair from being further written to any memory cell in the column. The delay between the change of address and the resulting deassertion of WPL signal 362 is indicated in the figure at $t_{DWPL}$. The delay $t_{DWPL}$ comprises the delays of ATD circuits 312 or 341, NAND gate 370, inverter 371, and any other delays in the circuit path from the pins for the X or Z address signals 350 and 353 to the WPL signal 362.

At about the same time that WPL signal 362 transitions low, an EQ signal 356 output by an EQ circuit 342 transitions high in response to the change in address A (not shown in FIG. 3A). The assertion of the EQ signal precharges and equalizes the pair of BL/$\overline{BL}$ and local I/O bus 364 using precharge transistors (not shown) and transistor 330 (which may be eliminated in some implementations). This operation prevents the data stored on the BL/$\overline{BL}$ pair from being further written to any memory cell in the column.

A period of time after the receipt of address $A_2$, indicated at $t_{DWL}$ in FIG. 3A, WL signal 360 and BLK signal 359 transition low in response to the changed address. At the same time, a different word line and block select line corresponding to address $A_2$ (not shown) transition high. The delay $t_{DWL}$ comprises the delays of decoders 310 or 345, WL 360 or BLK line 359, and any other delays in the circuit path from the pins for the X or Z address signals 350 and 353 to WL 360 or BLK line 359.

Write control circuit 316 is designed such that the delay for the circuit generating WPL signal 362, $t_{DWPL}$, is shorter than the delay for the circuit generating the word line and block select signals, $t_{DWL}$. This ensures that write circuit 339 is disabled before the selected word line and block select line change in response to the change of address from $A_1$ to $A_2$. This is generally easy to achieve because the components of the circuit generating WPL 362, such as ATD circuits 312 and 341, are typically much faster than the components of the circuit generating WL 360 and BLK 359, such as decoders 310 and 345. The delays of ATD circuits 312 and 341 and decoders 310 and 345 will be discussed in more detail below.

Figure 1:
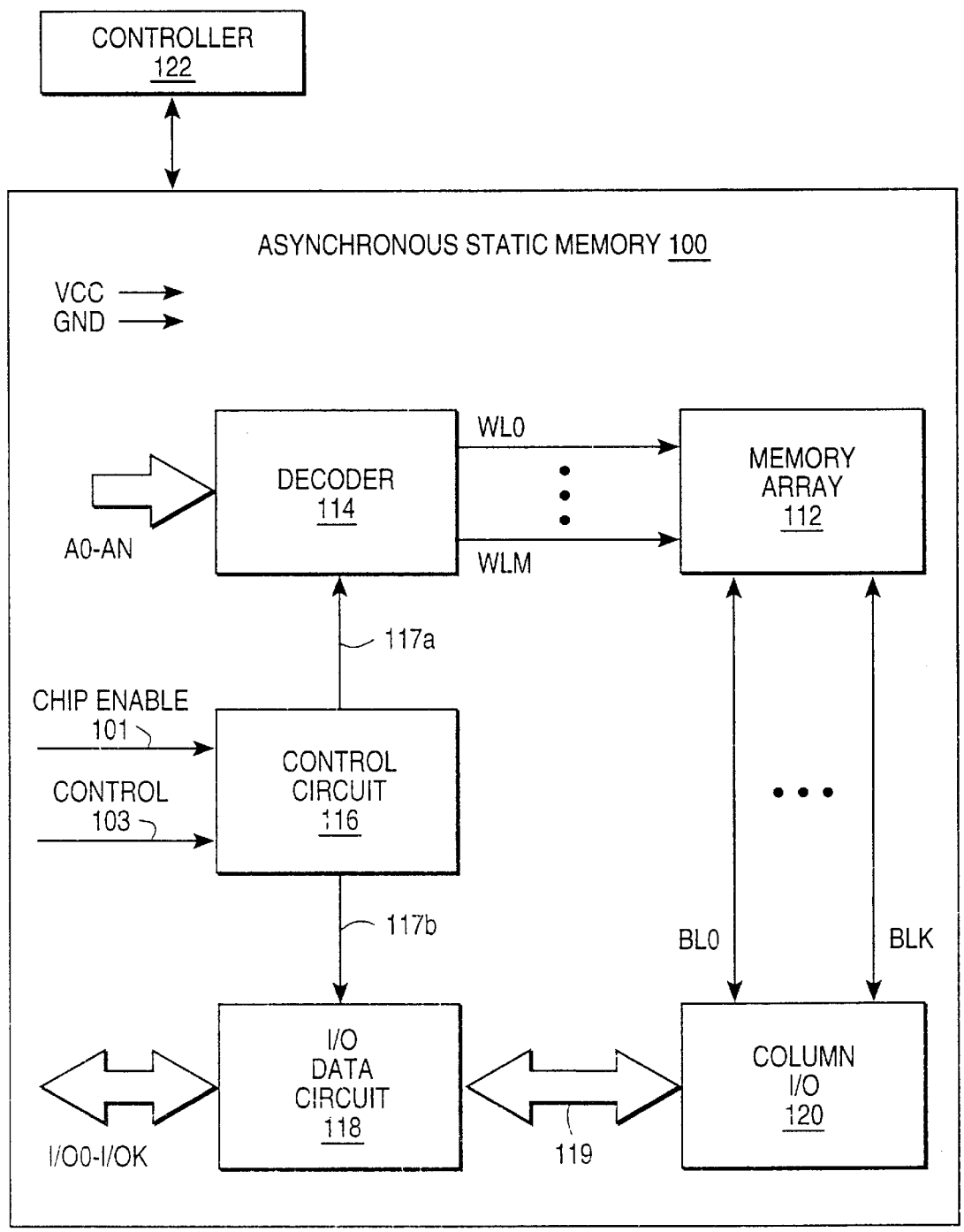
FIG. 1 illustrates a block diagram of an asynchronous static memory in which the present invention can be practiced.
Figure 2:
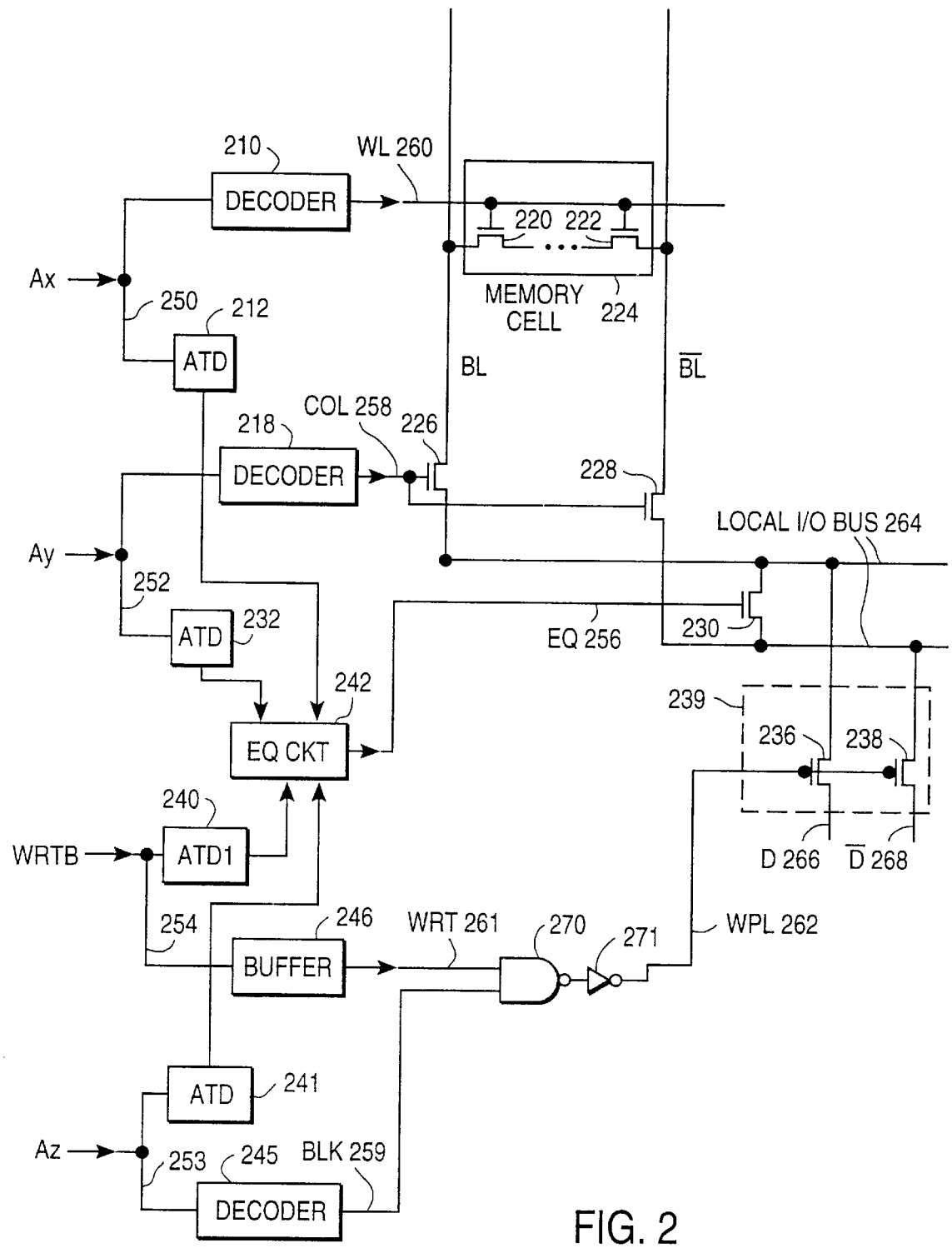
FIG. 2 illustrates a conventional control circuit for the memory of FIG. 1.
Figure 2A:
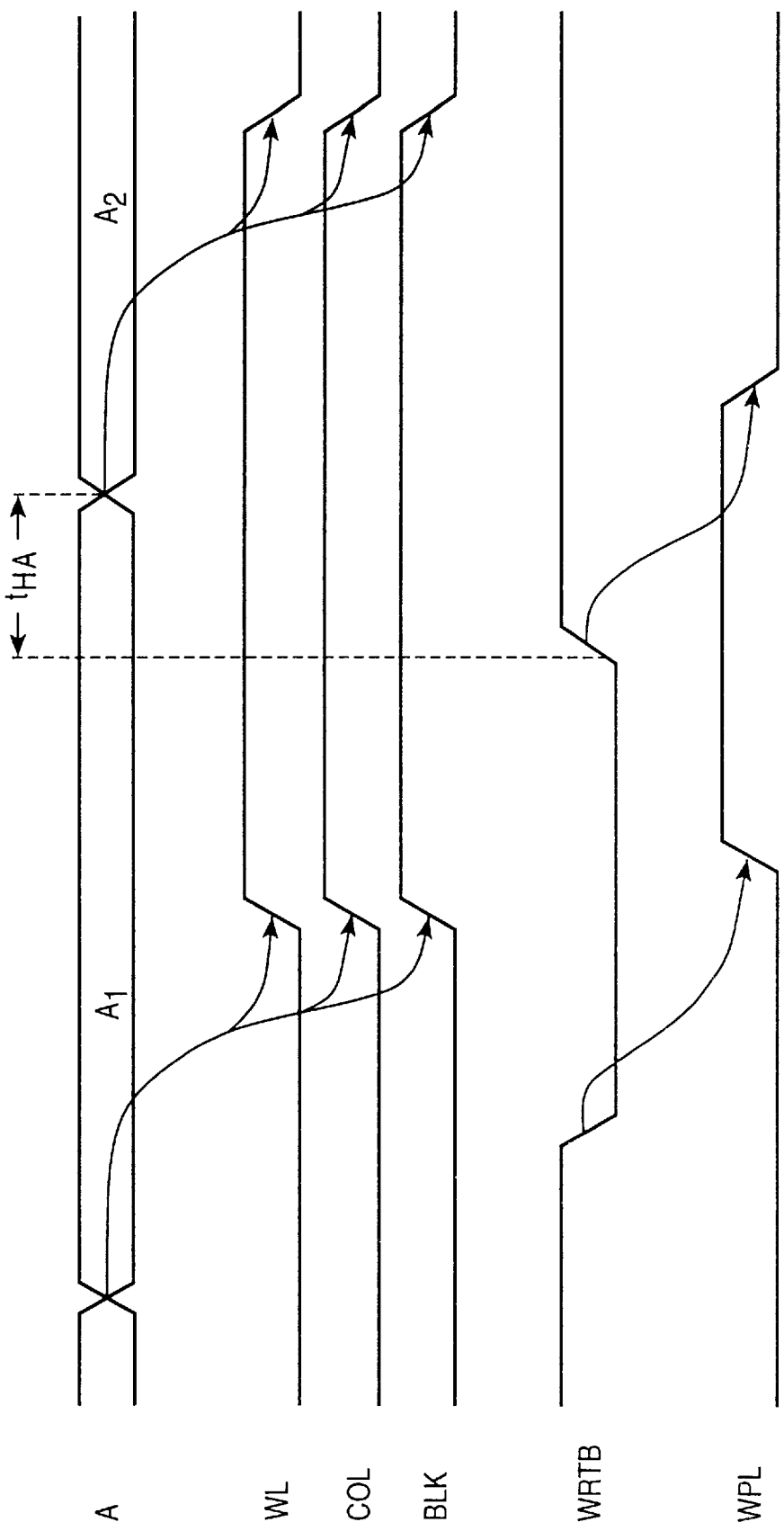
FIG. 2A illustrates a timing diagram for a write operation for the control circuit of FIG. 2.

Shortly after the receipt of address $A_2$, WRTB signal 354 is deasserted to indicate the end of the write operation. In contrast to the timing for the conventional memory illustrated in FIG. 2A, WRTB signal 354 is deasserted after rather than before the change of address. Therefore, the write address hold time $t_{HA}$ shown in FIG. 3A is negative.

A short time after the deassertion of WRTB signal 354, WRT signal 361 transitions low in response.

A period of time after ATDXNOR1 380 and/or ATDXNOR2 381 transition low, indicated as $t_{pw}$ in FIG. 3A, ATDXNOR1 380 and ATDXNOR2 381 transition high, forming an active low pulse $t_{pw}$ wide. The transitioning high of ATDXNOR1 380 and ATDXNOR2 381 would, in other circumstances, cause WPL signal 362 to also transition high, as indicated by the dotted line in FIG. 3A. However, since WRT signal 361 has transitioned low before ATDXNOR1 380 and ATDXNOR2 381 transitioned high, WPL signal 362 remains low to keep write circuit 339 disabled. ATD circuits 312 and 341 are designed such that pulse width $t_{pw}$ is of sufficiently long duration to ensure that this sequence of signal transitions occurs under a wide variety of signal timing conditions.

Figure 4:
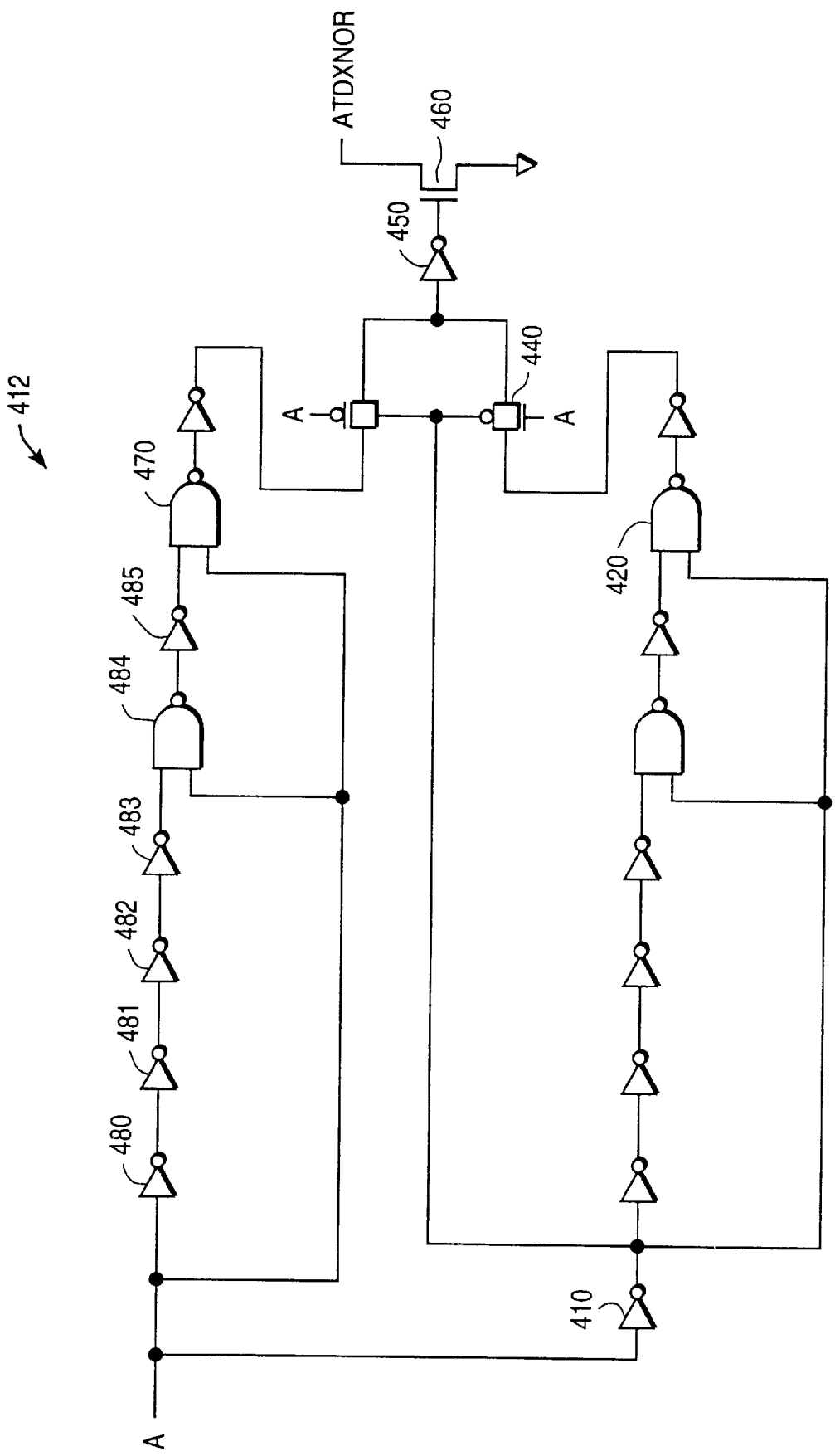
FIG. 4 illustrates a portion of an address transition detection circuit in accordance with an embodiment of the present invention.

FIG. 4 illustrates a portion of an embodiment of the ATD circuits 312, 332 and 341 in write control circuit 316. FIG. 4 shows a subcircuit 412 of the ATD circuits for handling an individual line of address signals Ax, Ay or Az. The outputs from several of these ATD subcircuits are combined in each of the ATD circuits 312, 332 and 341. The operation of ATD circuits is well known in the art and therefore, only the aspects of the ATD circuit particularly pertinent to the present invention will be described herein.

The ATD subcircuit 412 includes an input A for coupling to an individual line of address signals Ax, Ay or Az. ATD subcircuit 412 also includes an output ATDXNOR. Output ATDXNOR is coupled to the ATDXNOR outputs of all other ATD subcircuits 412 contained in the same ATD circuit. Output ATDXNOR is also coupled to an input of NAND gate 370 in write control circuit 316. The time required for ATD subcircuit 412 to generate a pulse at output ATDXNOR in response to a transition of input A comprises the delays of four gates or transistors—inverters 410 and 450, a pass transistor 440, and a pull-down transistor 460.

Still referring to FIG. 4, the pulse width $t_{pw}$ of the pulse generated at output ATDXNOR is determined by the combined delay for the chain of six gates coupled to an input of either NAND gate 420 or NAND gate 470. For instance, for NAND gate 470 these gates comprise inverters 480, 481, 482, 483, and 485, and NAND gate 484.

Figure 5:
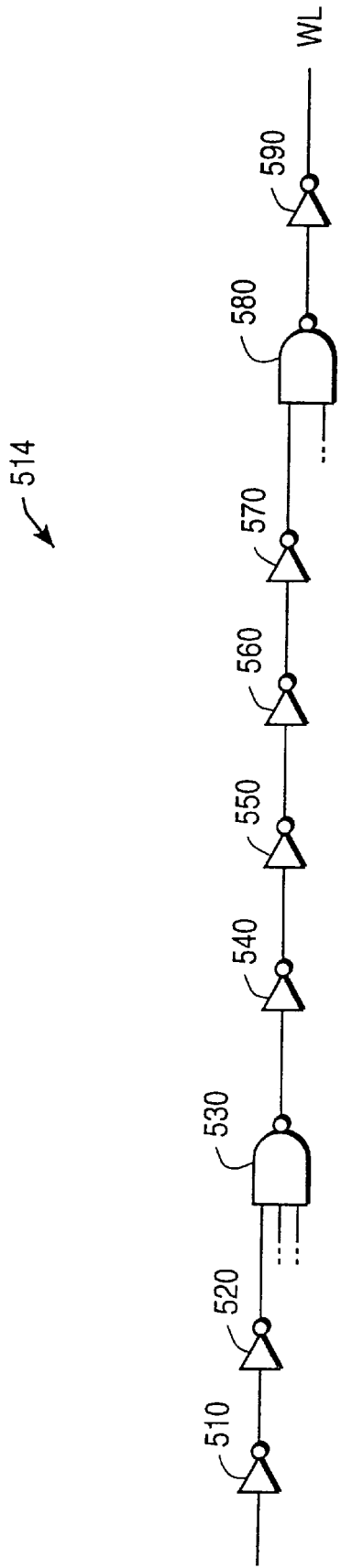
FIG. 5 illustrates a circuit path in a typical decoder for the memory of FIG. 1.

FIG. 5 illustrates a circuit path in a typical embodiment of decoders 310, 318 and 341 in memory 300. The operation of decoder circuits is well known in the art and therefore, only the aspects of the decoder circuit particularly pertinent to the present invention will be described herein. FIG. 5 shows a worst case (i.e., shortest) decoder circuit path 514 in decoders 310, 318 and 341. Decoder circuit path 514 includes an input A for coupling to an individual line of address signals Ax, Ay or Az. Decoder circuit path 514 also includes an output WL for coupling to one of the word lines, column select lines or block select lines of memory 300.

The delay for decoder circuit path 514 from input A to output WL depends on the number of bits in the corresponding address signal Ax, Ay or Az. For the embodiment shown, the delay for decoder circuit 514 from input A to output WL comprises the delays of nine gates—inverters 510, 520, 540, 550, 560, 570, and 590, and NAND gates 530 and 580. The delays for some of these gates, such as inverters 570 and 590, can be significant because of the large loads that these inverters must drive.

Therefore, it can be seen that the delay for ATD circuit 412 is significantly shorter than the delay for decoder circuit path 514. Although the delays for other embodiments of the ATD circuit and decoder may vary, the ATD circuit in virtually all cases has a significantly short delay than the decoder. Consequently, the delay for the circuit path generating WPL signal 362, $t_{DWPL}$, is shorter than the delay for the circuit path generating the word line and block select signals, $t_{DWL}$.

To summarize its operation, write control circuit 316 prevents data from being written to incorrect addresses in the memory by disabling write circuit 339 before the selected word line or block select line changes at the end of a write operation. Write control circuit 316 accomplishes this by both (1) using the same inputs as decoder 310 and 345 (i.e., X address signal Ax and Z address signal Az), and (2) having a shorter delay than the decoders.

Write control circuit 316 disables write circuit 339 upon detecting a change of address rather than upon the deassertion of WRTB signal 354. Because of this, address $A_1$ does not need to be held constant until the WRTB signal is deasserted in order to prevent writes to incorrect addresses. As a result, the required write address hold time $t_{HA}$ is reduced.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A write control circuit for an asynchronous random-access memory including a decoder and a write circuit, the write control circuit comprising:

an address input for receiving an address signal;

a write input for receiving a write signal that is asserted at a time associated with the beginning of a write operation and deasserted at a time associated with the end of the write operation; and control circuitry for generating an output signal that disables the write circuit whenever the address signal changes or the write signal is deasserted, the control circuitry disabling the write circuit in response to an address signal change for a predetermined amount of time sufficiently large to ensure that, for an address signal change that occurs before the end of the write operation, the write circuit remains disabled at least until the write signal is deasserted;

wherein the write control circuit has an associated delay from the address input to the generation of the output signal that is shorter than a delay of the decoder from an input for receiving the address signal to an output for generating a plurality of select signals.

2. The write control circuit of claim 1, wherein:

the address signal includes an X address signal and a Z address signal; and the plurality of select signals comprise a plurality of word line signals and a plurality of block select signals.

3. The write control circuit of claim 1, wherein the control circuitry further includes:

an address transition detection (ATD) circuit that generates a pulsed signal that disables the write circuit whenever the address signal changes, the pulsed signal having an associated pulse duration equal to the predetermined amount of time.

4. An asynchronous random-access memory, comprising:

a memory array;

a decoder coupled to the memory array including an input for receiving an address signal and an output for generating a plurality of select signals, wherein the decoder has an associated decoder delay from the input to the output;

a write circuit coupled to the memory array; and a write control circuit coupled to the write circuit including an address input for receiving the address signal, a write input for receiving a write signal that is asserted at a time associated with the beginning of a write cycle and deasserted at a time associated with the end of the write cycle, and control circuitry for generating a write pulse signal that disables the write circuit whenever the address signal changes or the write signal is deasserted, the control circuitry disabling the write circuit in response to an address signal change for a predetermined amount of time sufficiently large to ensure that, for an address signal change that occurs before the end of the write operation, the write circuit remains disabled at least until the write signal is deasserted;

wherein the write control circuit has an associated delay from the address input to the generation of the write pulse signal that is shorter than the decoder delay.

5. A method of writing data to an asynchronous random-access memory such that a write address hold time is minimized, comprising the steps of:

upon receiving a first address, decoding the first address to assert a first word line signal in the memory after a time equal to a decoder delay;

upon detecting the assertion of a write signal, enabling a write circuit in the memory to write an item of data corresponding to the first address to a location in the memory corresponding to the first word line signal;

upon receiving a second address, decoding the second address to assert a second word lie signal in the memory after a time equal to the decoder delay;

in response to the change of address and before the second word line signal is asserted, disabling the write circuit for a predetermined amount of time sufficiently large to ensure that the write circuit remains disabled at least until the write signal is deasserted; and upon detecting the deassertion of the write signal, disabling the write circuit.

* * * * *